(12) United States Patent
Nakata et al.

(10) Patent No.: US 8,987,122 B2
(45) Date of Patent: Mar. 24, 2015

(54) METHOD OF MANUFACTURING SEMICONDUCTOR DEVICE

(75) Inventors: Kazunari Nakata, Tokyo (JP); Tamio Matsumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/453,039

(22) Filed: Apr. 23, 2012

(65) Prior Publication Data

US 2013/0052812 A1 Feb. 28, 2013

(30) Foreign Application Priority Data

Aug. 26, 2011 (JP) ................. 2011-184441

(51) Int. Cl.
| | | |
|---|---|---|
| H01L 29/30 | (2006.01) | |
| H01L 21/304 | (2006.01) | |
| B24B 41/06 | (2012.01) | |
| B24B 7/22 | (2006.01) | |
| H01L 29/06 | (2006.01) | |

(52) U.S. Cl.
CPC ............ *H01L 21/304* (2013.01); *B24B 41/068* (2013.01); *B24B 7/228* (2013.01); *H01L 29/0657* (2013.01)
USPC ............................ 438/514; 438/690; 438/464

(58) Field of Classification Search
USPC ......................................................... 438/514
See application file for complete search history.

(56) References Cited

U.S. PATENT DOCUMENTS

| | | | | |
|---|---|---|---|---|
| 7,348,275 | B2 * | 3/2008 | Sekiya | 438/690 |
| 7,559,826 | B2 * | 7/2009 | Sekiya | 451/41 |
| 2003/0092244 | A1 * | 5/2003 | Oi et al. | 438/455 |
| 2007/0007247 | A1 * | 1/2007 | Sekiya | 216/88 |
| 2008/0280421 | A1 * | 11/2008 | Nakamura | 438/462 |
| 2009/0020854 | A1 * | 1/2009 | Feng et al. | 257/619 |
| 2011/0287609 | A1 * | 11/2011 | Kobayashi | 438/464 |

FOREIGN PATENT DOCUMENTS

| | | |
|---|---|---|
| JP | 2004-281551 | 10/2004 |
| JP | 2005-123425 | 5/2005 |

(Continued)

OTHER PUBLICATIONS

Office Action issued Aug. 29, 2013 in Korean Patent Application No. 10-2012-0091608, with partial English translation.
Office Action issued Dec. 10, 2013 in German Patent Application No. 10 2012 214 817.5 (with English-language Translation).
Office Action issued Feb. 25, 2014 in Korean Patent Application No. 10-2012-0091608 (with partial English-language translation).

(Continued)

*Primary Examiner* — Julio J Maldonado
*Assistant Examiner* — Jaehwan Oh
(74) *Attorney, Agent, or Firm* — Oblon, Spivak, McClelland, Maier & Neustadt, L.L.P.

(57) ABSTRACT

A method of manufacturing a semiconductor device, includes a wafer grinding step of, by means of a revolving grinding stone, forming a thinned portion in a wafer while at the same time forming a slope surrounding said thinned portion, wherein during said formation of said slope, said grinding stone is positioned so that there is always a space between said slope and the facing side of said grinding stone, wherein said thinned portion is thinner than a peripheral portion of said wafer, and wherein said slope extends along and defines an inner circumferential side of said peripheral portion and forms an angle of 75° or more but less than 90° with respect to a main surface of said wafer. The method of manufacturing a semiconductor device further includes a step of forming a semiconductor device in said thinned portion.

7 Claims, 6 Drawing Sheets

(56) References Cited

FOREIGN PATENT DOCUMENTS

| | | |
|---|---|---|
| JP | 2007-19379 | 1/2007 |
| JP | 2007-242699 | 9/2007 |
| JP | 2008-28325 | 2/2008 |
| JP | 2009-259941 | 11/2009 |
| JP | 2009-279661 | 12/2009 |
| JP | 2010-16188 | 1/2010 |
| JP | 2011-54808 | 3/2011 |
| JP | 2011071287 A * | 4/2011 |

OTHER PUBLICATIONS

Office Action issued Aug. 25, 2014, in Korean Patent Application No. 10-2012-0091608 with partial English translation.
Office Action issued Aug. 27, 2014 in Chinese Patent Application No. 201210304578.7 (with English translation).
Office Action issued Dec. 2, 2014 in Chinese Patent Application No. 2011-184441 (with English translation).
Office Action issued Dec. 2, 2014 in Japenese Patent Application No. 2011-184441 (with English translation).
Korean Trial Decision issued on Dec. 17, 2014 in Korean Patent Application No. 2012-0091608, with partial English translation.

* cited by examiner

METHOD OF MANUFACTURING SEMICONDUCTOR DEVICE

BACKGROUND OF THE INVENTION

1. Field of the Invention

The present invention relates to a method of manufacturing a semiconductor device used, e.g., for the control of industrial motors and vehicle motors, etc.

2. Background Art

Japanese Laid-Open Patent Publication No. 2009-279661 discloses a wafer in which a central portion has been ground by means of a grinding stone so that the wafer is thinner in the central portion and thicker in the peripheral portion. The grinding of the central portion of the wafer is such that the semiconductor devices formed in that portion have the desired thickness. The peripheral portion of the wafer is not ground in order to maintain the strength of the wafer.

Grinding of a wafer by use of a grinding stone results in the production of grindings or chips. If grinding's are caught between the grinding stone and the wafer and yet the grinding operation continues, local cracks may form in the wafer. Such cracks are referred to as "chippings." Crack propagation originating from these chippings can occur, which may result in breakage of the wafer, and chemical solution, etc. can be trapped on the wafer surface due to the chippings formed therein.

SUMMARY OF THE INVENTION

The present invention has been made to solve the above problems. It is, therefore, an object of the present invention to provide a method of manufacturing a semiconductor device whereby it is possible to grind a wafer while preventing the formation of chippings in the wafer. The features and advantages of the present invention may be summarized as follows.

According to one aspect of the present invention, a method of manufacturing a semiconductor device includes a wafer grinding step of, by means of a revolving grinding stone, forming a thinned portion in a wafer while at the same time forming a slope surrounding the thinned portion, wherein during the formation of the slope, the grinding stone is positioned so that there is always a space between the slope and the facing side of the grinding stone, wherein the thinned portion is thinner than a peripheral portion of the wafer, and wherein the slope extends along and defines an inner circumferential side of the peripheral portion and forms an angle of 75° or more but less than 90° with respect to a main surface of the wafer, and a step of forming a semiconductor device in the thinned portion.

Other and further objects, features and advantages of the invention will appear more fully from the following description.

DETAILED DESCRIPTION OF THE PREFERRED EMBODIMENT

Embodiment

Figure 1:
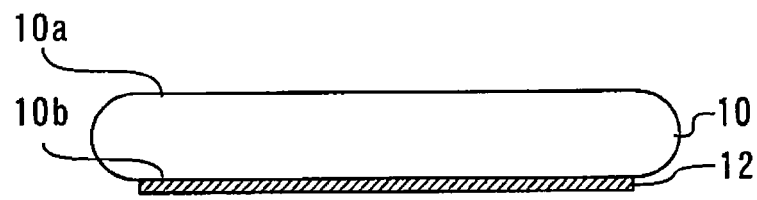
FIG. 1 is a cross-sectional view of a wafer before it is subjected to grinding.

A method of manufacturing a semiconductor device in accordance with an embodiment of the present invention will be described with reference to the accompanying drawings. FIG. 1 is a cross-sectional view of a wafer 10 before it is subjected to grinding. The wafer 10 is silicon and is formed, e.g., by the FZ method. The wafer 10 has a bottom surface 10a and a top surface 10b. (It should be noted that in FIG. 1 the wafer 10 is shown in an inverted orientation.) Semiconductor device structures such as, e.g., transistors and wiring structures are formed in the top surface 10b. The wafer 10 is then held so that the bottom surface 10a faces upward, and a protective tape 12 is attached to the top surface 10b of the wafer 10.

Figure 2:
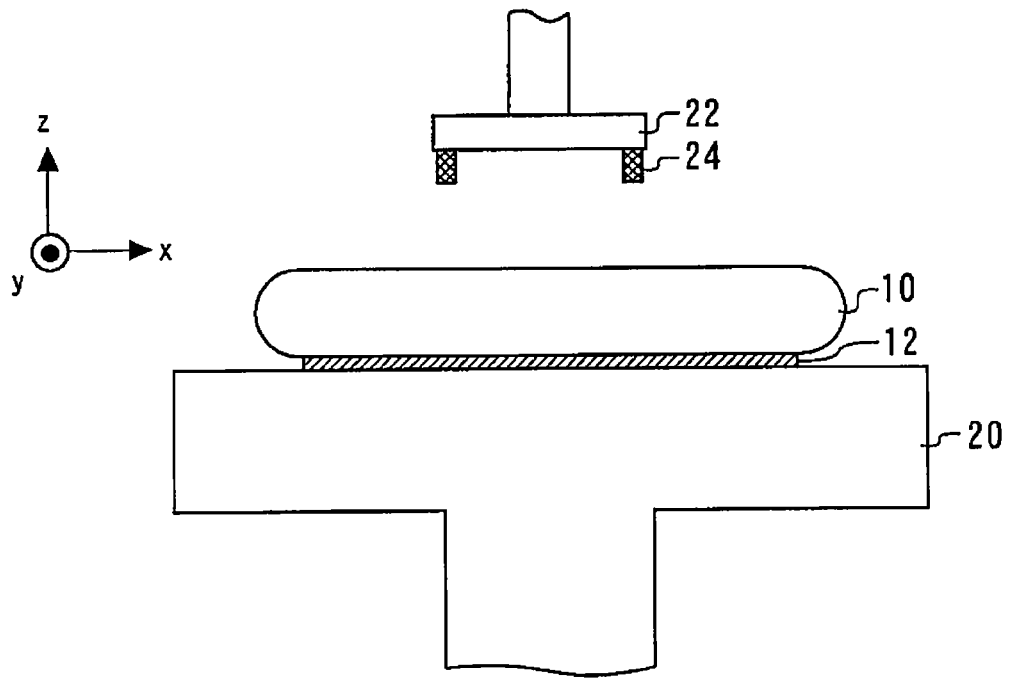
FIG. 2 is a diagram showing the wafer secured to the stage of the wafer grinding apparatus.
Figure 3:
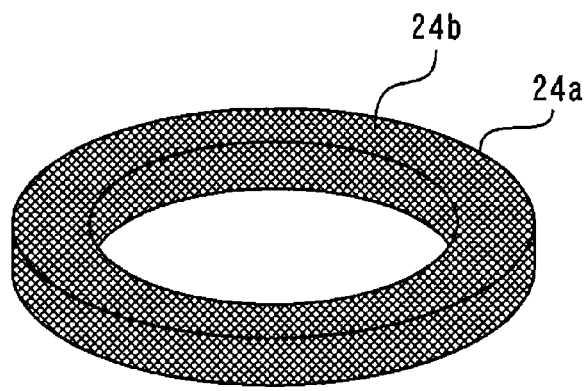
FIG. 3 is a perspective view of the grinding stone of FIG. 2, viewed obliquely from below.

The wafer 10 is then secured onto the stage of a wafer grinding apparatus. FIG. 2 is a diagram showing the wafer secured to the stage 20 of the wafer grinding apparatus. The securing of the wafer 10 to the stage 20 is accomplished by attaching the protective tape 12 to the stage 20 by means of suction. The wafer grinding apparatus is provided, above the stage 20, with a grinding wheel 22 and a grinding stone 24 secured to the grinding wheel 22. The shape of the grinding stone 24 will now be described. FIG. 3 is a perspective view of the grinding stone of FIG. 2, viewed obliquely from below. The grinding stone 24 has an overall annular shape. The grinding stone 24 has a corner portion 24a and a bottom surface 24b.

Figure 4:
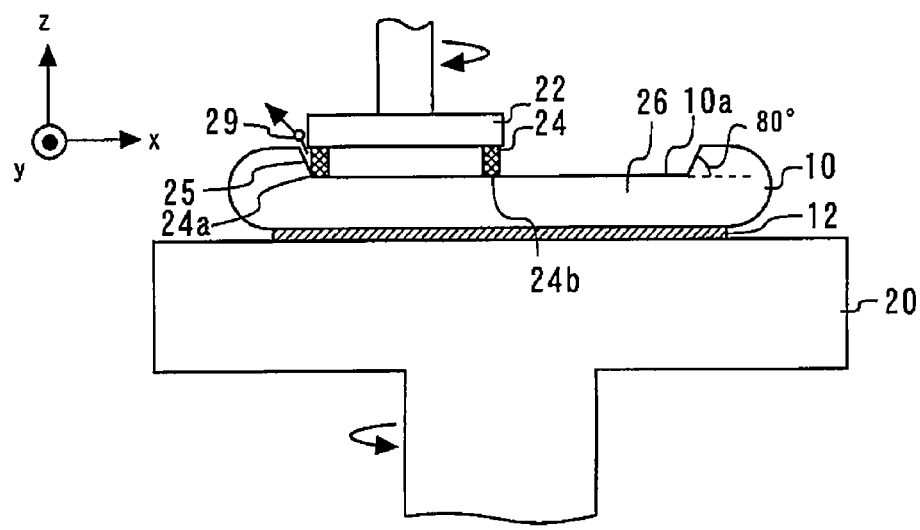
FIG. 4 is a diagram showing the way in which the wafer is ground by the wafer grinding apparatus.

Next, a grinding process is performed. FIG. 4 is a diagram showing the way in which the wafer is ground by the wafer grinding apparatus. In this grinding process, for example the stage 20 is rotated in the direction shown in FIG. 4 while the grinding wheel 22 with the grinding stone 24 thereon is rotated in the opposite direction. The grinding stone 24 is then brought into contact with the wafer 10 so as to grind the wafer 10. The grinding stone 24 alternates between movement parallel to the x-y plane shown in FIG. 4 and movement in the z-direction. This grinding forms a slope 25 and a thinned portion 26 in the wafer 10. It should be noted that the stage 20 and the grinding stone 24 need not necessarily be rotated in opposite directions.

The slope 25 is formed so as to extend along and define the inner circumferential side of the peripheral portion of the wafer 10 and form an angle of 75° or more but less than 90° with respect to the main surface (i.e., the bottom surface 10a) of the wafer. In the example shown in FIG. 4, the slope 25 forms an angle of 80° with the main surface of the wafer 10. In this grinding process, the slope 25 is formed by gradually moving the grinding stone 24 in the thickness direction of the wafer 10 in such a manner that there is always a space between the slope 25 and the facing side of the grinding stone 24. The slope 25 is formed primarily by use of the corner portion 24a of the grinding stone 24. It should be noted that FIG. 4 shows the way in which grindings 29 produced by the grinding operation are expelled through the space described above.

The thinned portion 26 is surrounded by the slope 25 and is formed to be thinner than the peripheral portion of the wafer 10. The thinned portion 26 is formed primarily by bringing the bottom surface 24b of the grinding stone 24 into contact with the wafer. The surface of the thinned portion 26 is flat. The thinned portion 26 has a thickness of, e.g., approximately 60 μm.

Figure 5:
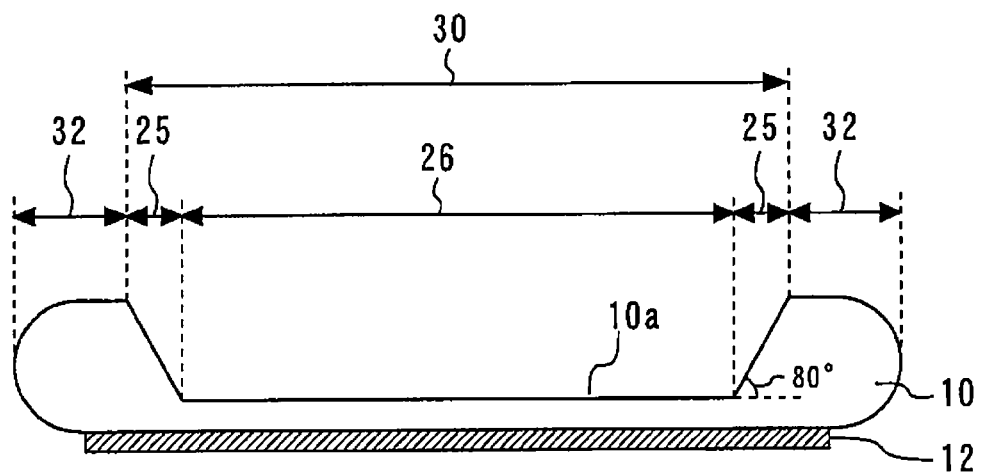
FIG. 5 is a cross-sectional view of the wafer after it has been subjected to the grinding process.
Figure 6:
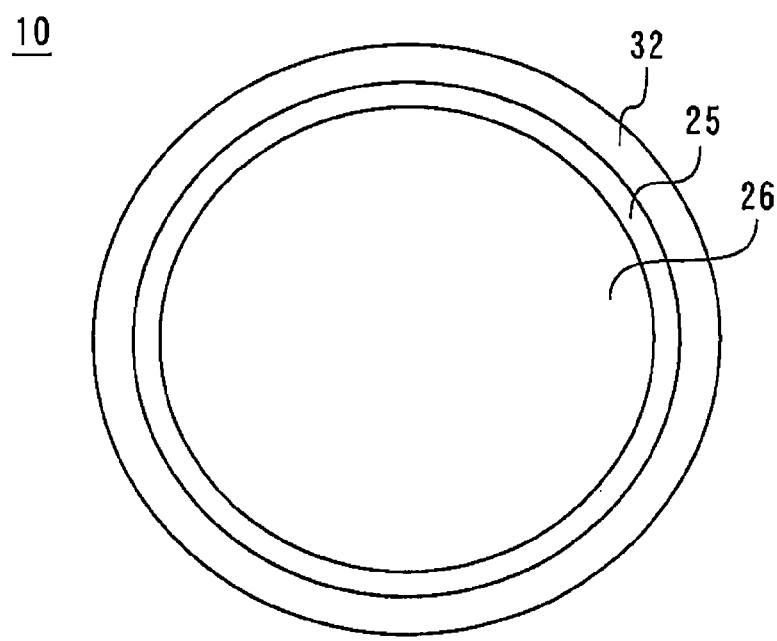
FIG. 6 is a plan view of the view of FIG. 5.

FIG. 5 is a cross-sectional view of the wafer after it has been subjected to the grinding process. The central portion 30 of the wafer 10 has the slope 25 and the thinned portion 26 formed therein. The central portion 30 of the wafer is surrounded by the unground peripheral portion 32 of the wafer. The unground peripheral portion 32 is referred to as a rib structure. FIG. 6 is a plan view of the view of FIG. 5. The peripheral portion 32 has an annular shape and extends along the periphery of the wafer 10.

Figure 7:
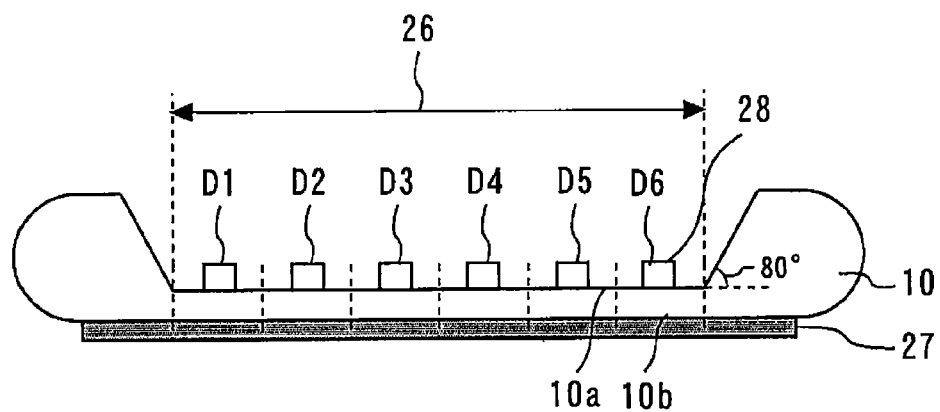
FIG. 7 is a cross-sectional view showing the semiconductor devices formed on the thinned portion.

Wet etching or dry etching is then performed to remove processing strains in the wafer which have been introduced during the grinding process. Further, the protective tape 12 is removed at an appropriate point in time. Semiconductor devices are then formed on the thinned portion. FIG. 7 is a cross-sectional view showing the semiconductor devices formed on the thinned portion. In this process, primarily only the bottom surface 10a of the thinned portion 26 is subjected to the necessary processing to form the semiconductor devices, since the top surface 10b of the wafer 10 already has semiconductor device structures formed therein, as described above. Specifically, this process includes a photolithography step, an ion implantation step, a thermal diffusion step, a film formation process such as sputtering, and an etching process. Further in this semiconductor device forming process, a first electrode 27 is formed on the top surface 10b of the thinned portion 26, and a second electrode 28 is formed on the bottom surface 10a. In cases where the semiconductor devices are IGBTs, the first electrode 27 is the emitter electrode and the second electrode 28 is the collector electrode. The cross-sectional view of FIG. 7 shows 6 semiconductor devices D1 to D6 formed on the thinned portion 26.

Figure 8:
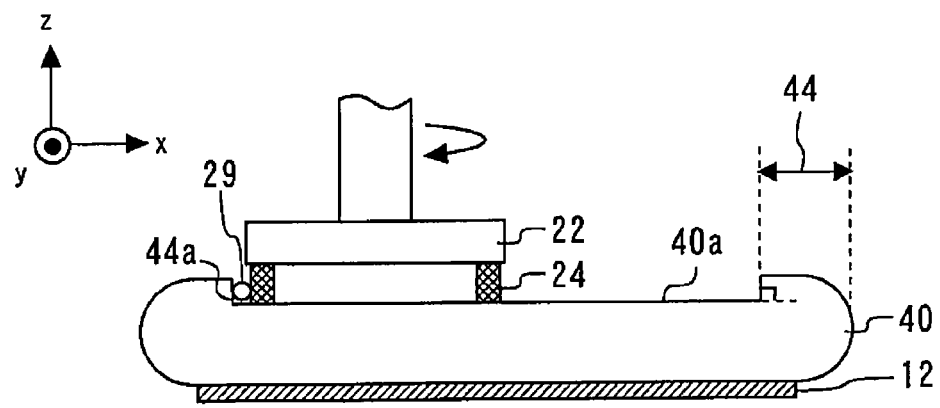
FIG. 8 is a cross-sectional view showing a conventional method of manufacturing a semiconductor device, which is presented for comparison purposes.

Before describing the advantages of the present invention, the following description will be directed to a comparative example. FIG. 8 is a cross-sectional view showing a conventional method of manufacturing a semiconductor device, which is presented for comparison purposes. In this method, the wafer, 40, is ground in such a manner that the inner circumferential side 44a of the peripheral portion 44 of the wafer 40 is perpendicular to the main surface 40a of the wafer 40. That is, the inner circumferential side 44a of the peripheral portion 44 forms an angle of 90° with the main surface 40a of the wafer. In this case, grindings 29 are caught between the inner circumferential side 44a and the grinding stone 24, resulting in the formation of chippings in the inner circumferential side 44a. After the completion of this grinding process, semiconductor devices are formed by the same semiconductor device forming process as that described above in connection with the present embodiment.

Figure 9:
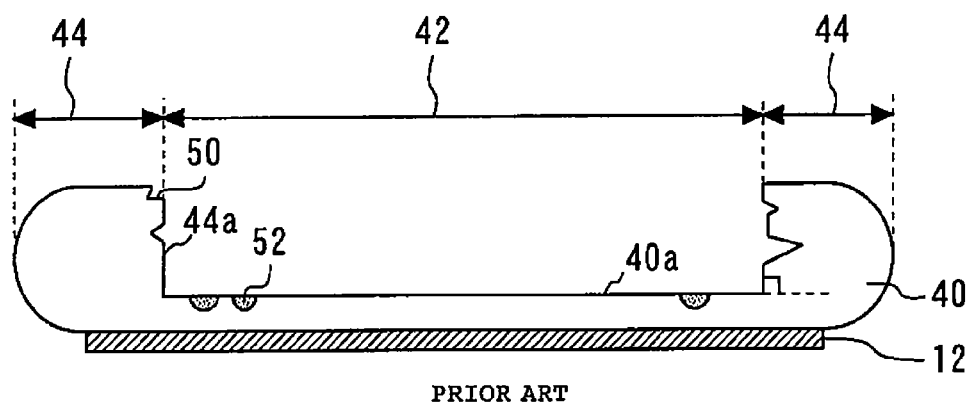
FIG. 9 is a cross-sectional view of the wafer after it has been ground and then processed by the above comparative conventional method.
Figure 10:
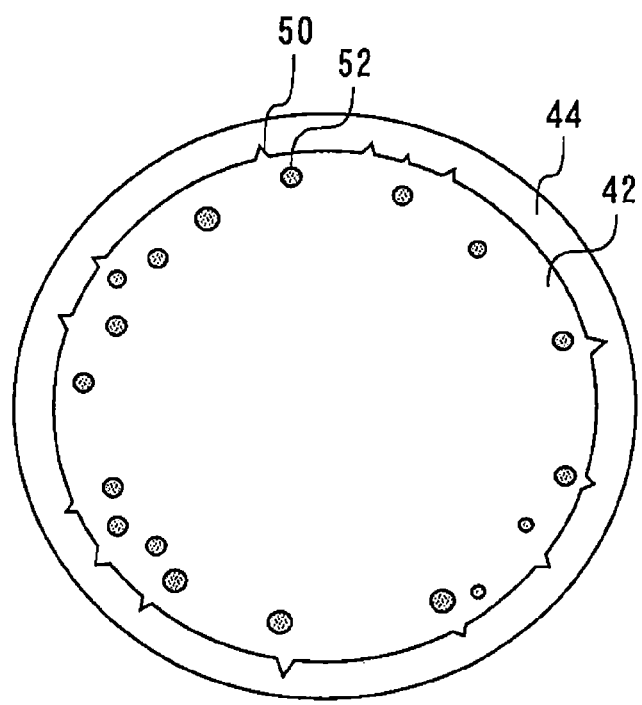
FIG. 10 is a plan view of the view of FIG. 9.

FIG. 9 is a cross-sectional view of the wafer after it has been ground and then processed by the above comparative conventional method. FIG. 10 is a plan view of the view of FIG. 9. As shown, the inner circumferential side 44a has a plurality of chippings 50. Therefore, handling the wafer 40 may cause crack propagation originating from the chippings 50, which may result in breakage of the wafer 40. Further as shown in FIG. 9, there are stains 52 on the thinned portion 42. These stains 52 are remains of the chemical solution, photoresist, developing solution, etc. that were used in wet processing and photolithography processing after the wafer grinding process. The stains 52 are trapped in chippings and adhering to the thinned portion 42; that is, they have not been able to be removed even by spin drying. If an electrode is formed on a portion of the thinned portion 42 having a stain 52, that stain 52 functions as a resistive layer, resulting in variations in the characteristics of the semiconductor devices.

The method of manufacturing a semiconductor device in accordance with the present embodiment, on the other hand, makes it possible to grind a central portion of a wafer while preventing the formation of chippings in the wafer. Specifically, referring back to FIG. 4, which shows the wafer grinding process used by this manufacturing method, the slope 25 is formed by gradually moving the grinding stone 24 in the thickness direction of the wafer 10 in such a manner that there is always a space between the slope 25 and the facing side of the grinding stone 24. As a result, grindings 29 produced by the grinding operation are expelled through the space, making it possible to prevent the formation of chippings in the wafer.

More specifically, the wafer is ground in such a manner that the slope 25 forms an angle of 75° or more but less than 90° with respect to the main surface of the wafer. As a result of the presence of the slope 25, the grindings 29, which have been thrown off by the rotational motion of the grinding stone, are readily expelled through the abovementioned gap. Further, in the present embodiment, primarily only the corner portion 24a of the grinding stone 24 is in contact with the slope 25 during the grinding process. Therefore, in the present embodiment, the grindings 29 can be readily expelled to the outside, as compared to the above comparative example in which the grinding stone 24 is brought into surface contact with the inner circumferential side 44a.

Figure 11:
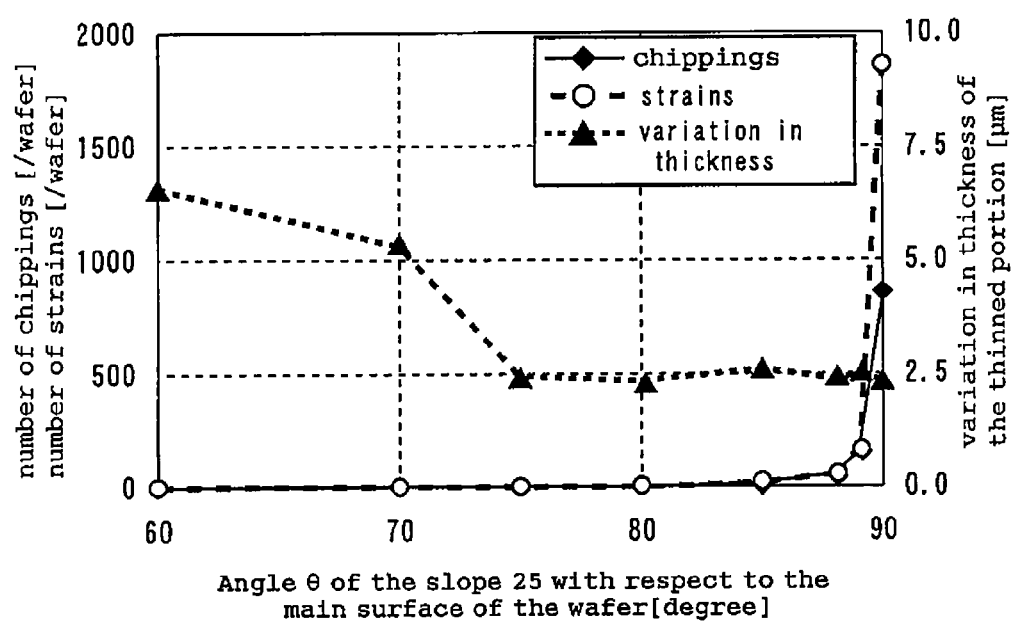
FIG. 11 is a graph showing the dependence of the number of chippings, the number of stains, and the variation in thickness of the thinned portion on the angle θ of the slope with respect to the main surface of the wafer.

The following describes the effect resulting from the fact that the slope 25 forms an angle of 75° or more but less than 90° with respect to the main surface of the wafer 10. FIG. 11 is a graph showing the dependence of the number of chippings, the number of stains, and the variation in thickness of the thinned portion on the angle θ of the slope 25 with respect to the main surface of the wafer. Data collected for this graph was obtained from a wafer sample in which the thinned portion had been ground to a thickness of 50 μm. The number of chippings and the number of stains rapidly increase as θ approaches 90°. The reason for this is thought to be that when θ is substantially 90°, the grindings are difficult to expel, as in the case of the comparative example. In the semiconductor device manufacturing method of the present embodiment, since the angle θ of the slope 25 is less than 90°, the grindings 29 can be expelled along the slope 25, making it possible to reduce the number of chippings and the number of stains.

In the case of semiconductor devices such as IGBTs and MOSFETs, since a current flows in the thickness direction of the thinned portion, a variation in the thickness of the thinned portion results in a variation in the characteristics of the semiconductor device. Therefore, it is desirable to minimize the variation in thickness of the thinned portion. Referring to FIG. 11, the variation in thickness of the thinned portion increases when θ is less than 75°. In the semiconductor device manufacturing method of the present embodiment, the slope 25 is formed in such a manner that θ is 75° or more, meaning that the variation in thickness of the thinned portion is relatively small. The reason why the variation in thickness of the thinned portion increases when the angle θ of the slope 25 is less than 75° is thought to be as follows: In order to form such a slope it is necessary to move the grinding stone an increased distance in a direction parallel to the main surface of the wafer. This results in a reduced degree of parallelism between the grinding stone and the main surface of the wafer and hence an increased variation in the thickness of the thinned portion.

Various alterations may be made to the semiconductor device manufacturing method of the present embodiment without departing from the features of the invention.

In accordance with the present invention, a wafer is ground while expelling the grindings to the outside, making it possible to prevent the formation of chippings in the wafer.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-184441, filed on Aug. 26, 2011 including specification, claims, drawings and summary, on which the Convention priority of the present application is based, are incorporated herein by reference in its entirety.

What is claimed is:

1. A method of manufacturing a semiconductor device, comprising:
 a wafer grinding step of, using a revolving grinding stone, forming a thinned portion in a wafer and simultaneously forming a slope surrounding said thinned portion, wherein during said formation of said slope, said grinding stone is positioned so that there is always a space between said slope and a side of said grinding stone facing said slope,
 wherein said thinned portion is thinner than a peripheral portion of said wafer,
 wherein said slope extends along and defines an inner circumferential side of said peripheral portion and forms an angle of 75° or more but less than 90° with respect to a main surface of said wafer, and
 wherein a variation of thickness of said thinned portion of said wafer is at or about a constant value for any of said angles of 75° or more but less than 90°; and
 a step of forming a semiconductor device on said thinned portion.

2. The method according to claim 1, wherein said step of forming said semiconductor device includes a photolithography process, an ion implantation process, a thermal diffusion process, a film formation process, or an etching process.

3. The method according to claim 1, wherein said step of forming said semiconductor device includes forming a first electrode on a top surface of said thinned portion and a second electrode on a bottom surface of said thinned portion.

4. The method according to claim 1, wherein a number of chippings, a number of stains, and said variation in thickness of said thinned portion of said wafer are dependent on said formed angle.

5. The method according to claim 1, further comprising:
 rotating said stage in a first direction opposite to a second direction of rotation of said revolving grinding stone while forming said thinned portion.

6. The method according to claim 1, wherein a thickness of said thinned portion of said wafer is between 50μm and 60μm.

7. The method according to claim 1, wherein said constant value is 2.5μm.

* * * * *